US012665600B2

(12) United States Patent
Agarwal et al.

(10) Patent No.: US 12,665,600 B2
(45) Date of Patent: Jun. 23, 2026

(54) SHARED CLOCK DUAL EDGE-TRIGGERED FLIP-FLOP CIRCUIT

(71) Applicant: Intel Corporation, Santa Clara, CA (US)

(72) Inventors: Amit Agarwal, Hillsboro, OR (US); Steven K. Hsu, Lake Oswego, OR (US); Ram Kumar Krishnamurthy, Portland, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 18/081,907

(22) Filed: Dec. 15, 2022

(65) Prior Publication Data

US 2024/0204782 A1 Jun. 20, 2024

(51) Int. Cl.
H03K 19/094 (2006.01)
H03K 19/017 (2006.01)
H03K 19/1776 (2020.01)

(52) U.S. Cl.
CPC ................ H03K 19/09425 (2013.01); H03K 19/01728 (2013.01); H03K 19/1776 (2013.01)

(58) Field of Classification Search
CPC ....... H03K 19/09425; H03K 19/01728; H03K 19/1776

USPC ....... 365/189.05, 154; 326/39, 38, 41, 40, 6; 714/724; 327/212, 218
See application file for complete search history.

(56) References Cited

U.S. PATENT DOCUMENTS

| | | | | |
|---|---|---|---|---|
| 12,401,350 B1 * | 8/2025 | Divvela | ................. | H03K 3/037 |
| 2004/0008055 A1 * | 1/2004 | Khanna | .............. | H03K 19/1776 326/40 |
| 2024/0283435 A1 * | 8/2024 | Kumar | ........... | G01R 31/318541 |

* cited by examiner

*Primary Examiner* — Arnold M Kinkead
(74) *Attorney, Agent, or Firm* — Schwegman Lundberg & Woessner, P.A.

(57) ABSTRACT

Some embodiments include an apparatus having a flip-flop circuit, which can include a first tristate inverter, a second tristate inverter including an input node coupled to an input node of the first tristate inverter; a first additional inverter including, and a second additional inverter including an output node coupled to an output node of the first additional inverter; a first memory including a first memory node coupled to an output node of the second tristate inverter, and a first additional memory node coupled to an input node of the first additional inverter; and a second memory including a second memory node coupled to an output node of the first tristate inverter, and a second additional memory node coupled to an input node of the second additional inverter.

22 Claims, 3 Drawing Sheets

SHARED CLOCK DUAL EDGE-TRIGGERED FLIP-FLOP CIRCUIT

TECHNICAL FIELD

Embodiments described herein pertain to integrated circuit (IC) devices and systems. Some embodiments relate to flip-flop circuitry.

BACKGROUND

Improving power efficiency (e.g., operation per watt) is one of the primary design challenges for modern components, such as microprocessors, discrete graphics, digital signal processors (DSPs), and hardware accelerators in laptops, servers, and other electronic devices and system. However, these designs still need to meet the required performance target while operating under a tight power envelope. One of the strongest ways to reduce power and improve power efficiency in such designs is to lower the supply voltage. However, lowering supply voltage can result in performance loss due to degradation of transistor $I_{ON}$ current. Simultaneous scaling of supply voltage and transistor threshold voltage (Vt) may recuperate the $I_{ON}$ current reduction due to lower supply voltage. However, such low-Vt transistor can significantly increase the leakage power component of total power. Ultra-low-temperature (ULT) operation may provide a benefit of increased mobility and steeper sub-threshold slope, resulting in enhanced transistor $I_{ON}$/IOFF current ratio. Low-Vt transistor at ultra-low-voltage (ULV) with ULT results in a process voltage and temperature (PVT) corner, which can achieve improved performance while significantly reducing both dynamic/leakage power. However, ULT often requires extreme low voltage operation to keep the device cooling cost overhead at a manageable level. It can be a challenge to develop techniques and circuitry that enable low supply voltage operation (Vmin), low power, and high performance at such low temperatures.

DETAILED DESCRIPTION

Some techniques described herein involve a shared clock DET Mux-D scan flip-flop circuit. The described flip-flop circuit can be used in devices and systems such as microprocessors, discrete graphics, DSPs, and hardware accelerators in laptops, servers, and other devices and systems. The flip-flop circuit described herein enables energy-efficient ultra-low-temperature and voltage design.

A major component of the power dissipation in digital systems is due to charging and discharging load capacitance of circuit nodes, otherwise known as dynamic power. In modern clocked synchronous systems (e.g., microprocessors, DSPs, artificial intelligence (AI), machine learning, and servers), a large percentage of the overall power dissipation (e.g., greater than 50%) is in the clock grid and final sequential load. One way to reduce this clock power contribution is to operate the clock at half frequency while converting sequential circuitry to a double edge-triggered (DET) flip-flop, which stores data at both edges (rising and falling) of the clock, to preserve frequency. In this description double edge-triggered and dual edge-triggered are used interchangeably. Running the clock at half frequency reduces clock switching by half, thereby improving clock grid power in some cases by about 50%. Triggering at both clock edges often requires a DET flip-flop to be implemented with a relatively high number of clock transistors compared with a single-edge-triggered (SET) flip-flop. For example, some conventional DET flip-flops may include 16 clock transistors, whereas some conventional SET flip-flops may include fewer than 16 clock transistors. The flip-flop normally contributes about 60% of the total clock power. Thus, any extra power consumed in the DET flip-flop may lower the overall power savings by half frequency double edge-triggered clocking. Therefore, to achieve maximum power gain at block level using a half-frequency clock, the described flip-flop circuit has relatively low power consumption in comparison with some conventional DET flip-flops. Lower power consumption allows the described flip-flop circuit to be suitable for energy-efficient ultra-low-temperature and voltage design. Other improvements and benefits of the described flip-flop circuit are discussed in more detail below with reference to FIG. 1 through FIG. 3.

Figure 1:
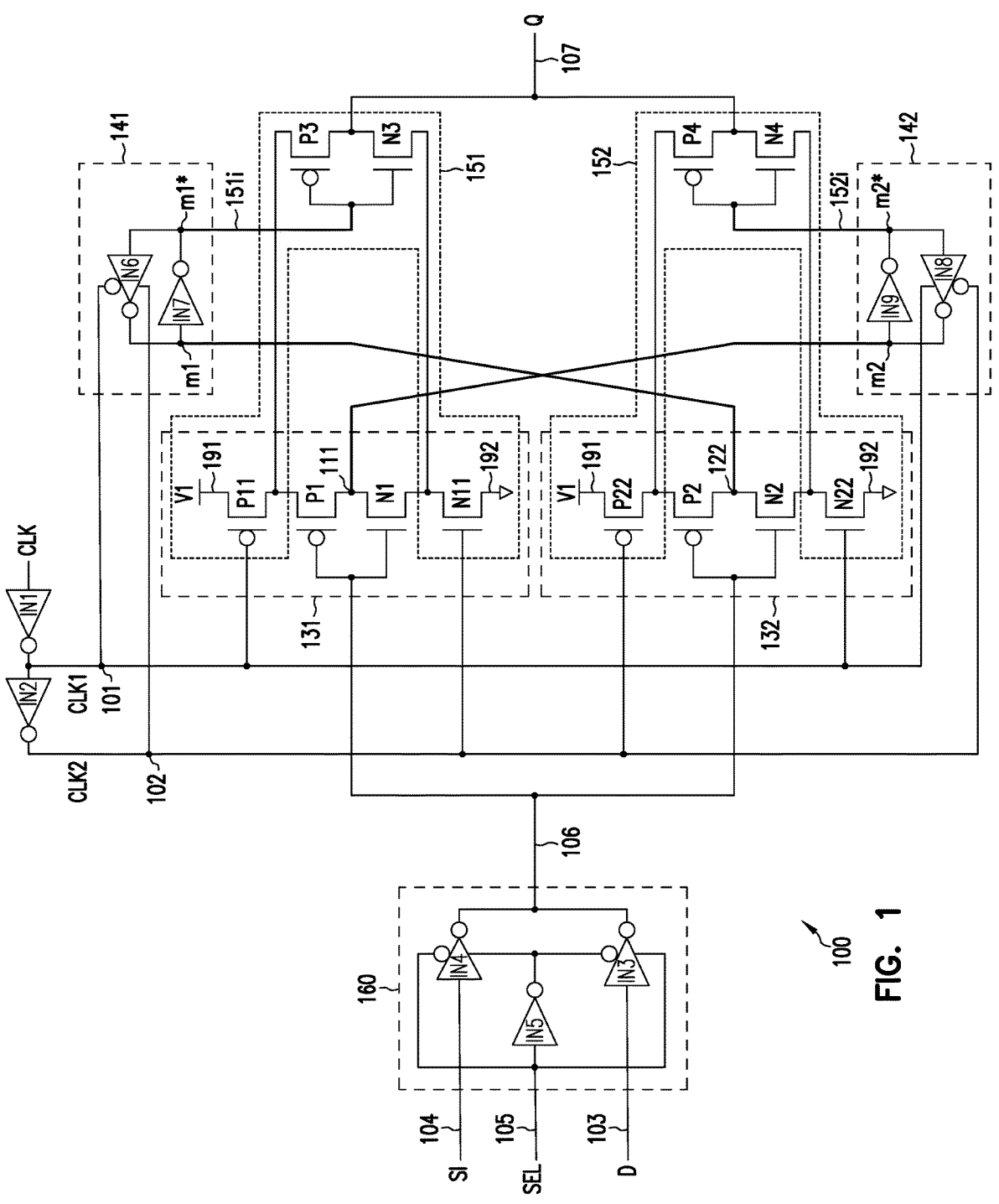
FIG. 1 shows an apparatus in the form of a shared clock dual edge-triggered (DET) multiplexer (Mux) D scan flip-flop circuit, according to some embodiments described herein.

FIG. 1 shows an apparatus in the form of a flip-flop circuit 100, according to some embodiments described herein. Flip-flop circuit 100 can be used as a MUX-D scan flip-flop that can be controlled by (e.g., can be edge-triggered by) two clock signals. Flip-flop circuit 100 can include clock transistors (described below) in which some of the clock transistors can be shared by some circuit elements of flip-flop circuit 100. Thus, flip-flop circuit 100 can be called shared clock DET MUX-D scan flip-flop circuit.

As shown in FIG. 1, flip-flop circuit 100 can include a multiplexer (MUX) 160, tristate inverters 131 and 132, a memory (e.g., memory element) 141, a memory (e.g., memory element) 142, and tristate inverters 151 and 152. Tristate inverters 131 and 132 can be part of an input stage of flip-flop circuit 100. Memory 141 and memory 142 (e.g., memory elements 141 and 142) can be part of two respective latches of flip-flop circuit 100 that can operate to store (e.g., hold) information received by tristate inverters 131 and 132. Each of memory 141 and memory 142 can store one bit of information. Information (based on data information D or scan information SI) from memory 141 (e.g., from memory node m1*) can be provided to tristate inverter 151 (e.g., provided to the input node of tristate inverter 151). Information (based on data information D or scan information SI) from memory 142 (e.g., from memory node m2*) can be provided to tristate inverter 152 (e.g., provided to the input node of tristate inverter 152).

Tristate inverters 151 and 152 can be part of an output stage of flip-flop circuit 100 to provide information from memory 141 and memory 142 to a node 107 as information Q. Node 107 can be an output node of flip-flop circuit 100. The value of information stored in memory 141 and memory 142 (and the value of information Q) can be based on the value of either data information (e.g., data signal) D or scan information (e.g., test information) SI selected by MUX 160.

In the following description, inverters and tristate inverters are given respective labels (e.g., names) INV1 through INV11. However, for simplicity and to avoid crowding the drawings (FIG. 1 and FIG. 2), labels INV1 through INV11 described in the description are shown in the drawings as "IN1" through "IN11", respectively.

As shown in FIG. 1, MUX 160 can include tristate inverters INV3 and INV4, and an inverter INV5. MUX 160 can include input nodes 103 and 104 (which are coupled to the input nodes of tristate inverters INV3 and INV4, respectively) to receive data information (e.g., data signal) D and scan information (e.g., test information or signal) SI, respectively. MUX 160 can also include an input node (e.g., control input node) 105 coupled to the input node of inverter INV5 to receive select information (e.g., MUX select signal) SEL. Tristate inverters INV3 and INV4 can be controlled by select information SEL. In operation, data information D and scan information SI can be provided to MUX 160 at different times. For example, during a time interval (e.g., in a scan mode (e.g., test mode) of flip-flip circuit 101), scan information SI can be provided to MUX 160, which selects the provided scan information SI and provide it to the input nodes of tristate inverters 131 and 132. In another example, during another time interval (e.g., in a normal operating mode of flip-flip circuit 101), data information D can be provided to MUX 160, which selects the provided data information D and provide it to the input nodes of tristate inverters 131 and 132.

MUX 160 can operate to select between data information D and scan information SI based on the value of select information SEL. For example, MUX 160 can select information D in response to select information SEL having one value (e.g., a higher signal level). MUX 160 can select scan information SI in response to select information SEL having another value (e.g., a lower signal level). MUX 160 can provide the selected information (either data information D or scan information SI) at its output node, which is coupled to a node 106 of flip-flop circuit 100. Thus, the information at node 106 can be based on either data information D or scan information SI selected by MUX 160.

As shown in FIG. 1, tristate inverter 131 can include transistors N1, N11, P1, and P11, an input node (formed by the gates of transistors N1 and P1) coupled to node 106. Tristate inverter 131 can include an output node 111 (formed by the drains (or sources) of transistors N1 and P1) to provide information based on either data information D or scan information SI (selected by MUX 160). In this description the drain and source of a transistor is used interchangeably. As shown in FIG. 1, transistor P11 can be coupled to a supply node 191. Transistor N11 can be coupled to a supply node 192. Supply node 191 can receive a voltage V1, which can be a supply voltage (e.g., Vcc) of flip-flop circuit 100. Supply node 192 can receive a supply voltage (e.g., Vss) that can be at ground potential.

Tristate inverter 132 can include transistors N2, N22, P2, and P22, an input node (formed by the gates of transistors N2 and P2) coupled to the input node of tristate inverter 131 at node 106. Tristate inverter 132 can include an output node 122 (formed by the drains (or sources) of transistors N2 and P2) to provide information based on either data information D or scan information SI (selected by MUX 160). Transistor P11 can be coupled to a supply node 191. Tristate inverter 131 can include an output node 122 to provide information based on either data information D or scan information SI (selected by MUX 160). Transistor P22 can be coupled to supply node 191. Transistor N22 can be coupled to supply node 192.

Tristate inverter 151 can include transistors N3, P3, N11, and P11, and an input node formed by the gates of transistors N3 and P3. Tristate inverter 151 can include an output node (formed by the drains (or sources) of transistors N3 and P3)

coupled to node 107. Tristate inverter 151 can share transistors P11 and N11 with tristate inverter 131. For example, as shown in FIG. 1, transistors P1 and P3 of tristate inverters 131 and 151, respectively, can be coupled to a supply node 191 through the same transistor (e.g., transistor P11). In another the example, as shown in FIG. 1, transistors N1 and N3 of tristate inverters 131 and 151, respectively, can be coupled to a supply node 192 through same transistor (e.g., transistor N11).

Tristate inverter 152 can include transistors N4, P4, N22, and P22, and an input node formed by the gates of transistors N4 and P4. Tristate inverter 152 can include an output node (formed by the drains (or sources) of transistors N4 and P4) coupled to node 107. Tristate inverter 152 can share transistors P22 and N22 with tristate inverter 132. For example, as shown in FIG. 1, transistors P2 and P4 of tristate inverters 132 and 152, respectively, can be coupled to supply node 191 through the same transistor (e.g., transistor P22). In another example, as shown in FIG. 1, transistors N2 and N4 of tristate inverters 132 and 152, respectively, can be coupled to supply node 192 through same transistor (e.g., transistor N22).

Each of transistors N1, N11, N2, N22, and N3 can include a field effect transistor (FET) that can include an n-type (e.g., n-channel) metal-oxide semiconductor (NMOS) transistor. Each of transistors P1, P11, P2, P22, and P3 can include an FET that can include a p-type (e.g., p-channel) metal-oxide semiconductor (PMOS) transistor. NMOS and PMOS transistors are included in flip-flop circuit 100 as examples. However, other types of transistors can be used.

Memory 141 can include a tristate inverter INV6, an inverter INV7, and memory nodes m1 and m1*. Tristate inverter INV6 can include four transistors (not shown) like transistors N1, N11, P1, and P11 of tristate inverter 131. Each of memory nodes m1 and m1* of memory 141 can store information (e.g., a bit of information). The information stored at nodes m1 and m1* can have complementary values (e.g., "0" and "1"). As shown in FIG. 1, memory node m1 can be coupled to output node 122 of tristate inverter 132. Memory node m1* can be coupled to the input node of tristate inverter 151 through a connection (e.g., conductive line) 151i.

Memory 142 can include a tristate inverter INV8, an inverter INV7, and memory nodes m2 and m2*. Tristate inverter INV8 can include four transistors (not shown) like transistors N2, N22, P2, and P22 of tristate inverter 132. Each of memory nodes m2 and m2* of memory 142 can store information (e.g., a bit of information). The information stored at nodes m2 and m2* can have complementary values (e.g., "0" and "1"). As shown in FIG. 1, memory node m2 can be coupled to output node 111 of tristate inverter 131. Memory node m2* can be coupled to the input node of tristate inverter 152 through a connection (e.g., conductive line) 152i.

As shown in FIG. 1, flip-flop circuit 100 can include clock nodes 101 and 102, and inverters INV1 and INV2. Clock nodes 101 and 102 can be coupled to the output nodes of inverters INV1 and INV2, respectively, to receive a clock signal CLK1 and a clock signal CLK2 provided at the output nodes of inverters INV1 and INV2, respectively. Clock signals CLK1 and CLK2 can be generated (e.g., provided) based on a clock signal CLK (e.g., input clock signal) through inverter INV1 and inverter INV2. Clock signals CLK1 and CLK2 can be inverted versions (complements) of each other. Clock signals CLK, CLK1, and CLK2 can have the same frequency.

Clock signals CLK1 and CLK2 can be provided to the gates of clock transistors of flip-flop circuit 100 to control the clock transistors. Flip-flop circuit 100 can include 12 clock transistors associated with clock signals CLK1 and CLK2. The clock transistors of flip-flop circuit 100 include two transistors (a p-type and an n-type transistor, not shown) in inverter INV1 and two transistors (a p-type and an n-type transistor, not shown) in inverter INV2. Transistors P11 and N11 are clock transistors, which have respective gates to receive clock signals CLK1 and CLK2, respectively. Transistors N22 and P22 are clock transistors, which have respective gates to receive clock signals CLK1 and CLK2, respectively.

Each of tristate inverters INV6 and INV8 of respective memory 141 and memory 142 can also include two clock transistors (not shown). For example, tristate inverter INV6 of memory 141 can include two clock transistors having different transistor types: a transistor (e.g., p-type transistor like transistor P11) having a gate to receive clock signal CLK1, and a transistor (e.g., n-type transistor like transistor N11) having a gate to receive clock signal CLK2. In another example, tristate inverter INV8 of memory 142 can include two clock transistors having different transistor types: a transistor (e.g., n-type transistor like transistor N22) having a gate to receive clock signal CLK1, and a transistor (e.g., p-type transistor like transistor P22) having a gate to receive clock signal CLK2.

As shown in FIG. 1, some of the circuit elements of flip-flop circuit 100 can share clock transistors. For example, as described above, tristate inverters 131 and 151 can share transistors N11 and P11 (which are clock transistors). In another example, as described above, tristate inverters 132 and 152 can share transistors N22 and P22 (which are clock transistors). Sharing clock transistors among circuit elements of flip-flop circuit 100 can reduce the clock load in flip-flop circuit 100. Further, sharing clock transistors among circuit elements of flip-flop circuit 100 allows it to have a reduced number of clock transistors (e.g., 12 clock transistors, as described above) in comparison with some conventional DET flip-flops. A reduced number of clock transistors can improve (e.g., reduce) power consumption in flip-flop circuit 100.

In an alternative structure of flip-flop circuit 100, connections 151i and 152i (FIG. 1) can be eliminated (e.g., broken). In such an alternative structure, the input node of tristate inverter 151 can be coupled to (e.g., directly coupled to) output node 122, and the input node of tristate inverter 152 can be coupled (e.g., directly coupled) to output node 111. However, coupling the input nodes of tristate inverters 151 and 152 to output nodes 122 and 111, respectively, in such an alternative structure of flip-flop circuit 100 can have drawbacks involving a charge sharing condition. For example, a charge sharing condition can occur in a situation when clock signal CLK1 is "1" (clock signal CLK1 is "0" and clock signal CLK2 is "1") and information data D switches from "1" to "0" (and information at node 106 switches from "0" to "1"). For one inversion, transistors (clock transistors) N22 and P22 are "off" and transistors N2 and N4 are "on". In the alternative structure of flip-flop circuit 100 (where the input node of tristate inverter 151 is coupled to output node 122 and connection 151i (FIG. 1) is eliminated), charge sharing condition can occur between node 107 and memory node m1 through transistors N4 and N2 (which are "on", in the situation mentioned above). This charge sharing in the alternative structure of flip-flop circuit 100 can corrupt the data under strong PVT variation.

In flip-flop circuit 100 shown in FIG. 1, coupling the input nodes of tristate inverters 151 and 152 to memory 141 and memory 142, respectively, through connections 151i and 152i can prevent an occurrence of the above-described charge sharing condition. For example, as shown in FIG. 1, there are two inverters (inverter INV7 and tristate inverter 151) between node 107 and memory node m1*, and two inverters (inverter INV7 and tristate inverter 152) between node 107 and memory node m2*. This same number of inverters (two inverters) creates even (the same) polarity between node 107 and memory node m2* and even (the same) polarity between node 107 memory node m2*. Since charge-sharing node 107 and m1 and charge-sharing node 107 and m2 have the same polarity, it prevents charge sharing across all combinations of clock and data toggling. Preventing such a charge sharing can improve the operation and the reliability (e.g., prevent corruption of data) of flip-flop circuit 100 over an alternative structure of flip-flop circuit 100 (discussed above) and can maintain robustness of flip-flop circuit 100 under PVT variations.

As shown in FIG. 1, memory node m2 may be exposed to output glitch at node 107. However, such an output glitch may need to go through two transistors (e.g., transistors P3 and P1 in a circuit path between node 107 and memory node m2). These two transistors can dampen potential noise associated with such output glitch.

Figure 2:
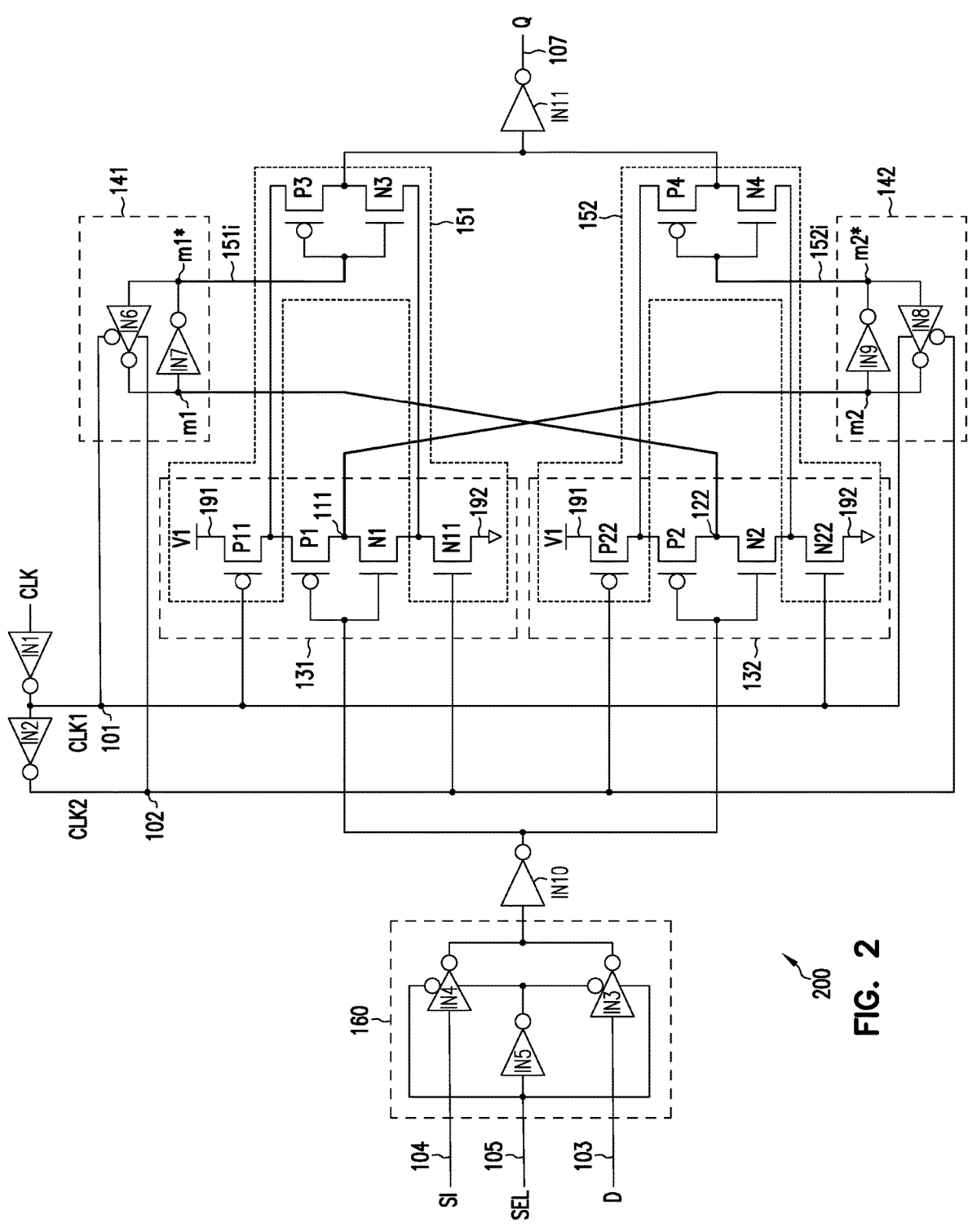
FIG. 2 shows a variation of the flip-flop circuit of FIG. 1, according to some embodiments described herein.

FIG. 2 shows an apparatus in the form of a flip-flop circuit 200, according to some embodiments described herein. Flip-flop circuit 200 can be a variation of flip-flop circuit 100. Thus, for simplicity, the same elements between flip-flop circuit 100 and flip-flop circuit 200 are given the same reference labels. Differences between flip-flop circuit 100 and flip-flop circuit 200 include the addition of inverters INV10 and INV11. As shown in FIG. 2, inverter INV10 can include an input node coupled to MUX 160 (e.g., coupled to the output node of MUX 160) an output node coupled to the input nodes of tristate inverters 131 and 132. Inverter INV11 can include an input node coupled the output nodes of tristate inverters 151 and 152, and an output node coupled to node 107. In operation, information (e.g., based on data information D or scan information SI) from tristate inverter 151 or 152 can be provided to the input node inverter INV11 coupled to an output node of the second tristate inverter. Inverter INV11 can provide information from its input node to node 107.

In comparison with flip-flop circuit 100 (FIG. 1), flip-flop circuit 200 trades off data power/delay for low clock power and robust operation by the addition of inverters INV10 and INV11 in flip-flop path as shown in FIG. 2. The addition of inverters INV10 and INV11 can remove potential output glitch at node 107 (FIG. 2) propagating to memory nodes m1 and m2 and provide scalability for higher drive flip-flop due to the addition of inverter INV11. In an example, flip-flop circuit 200 can be used in non-critical paths (e.g., greater than 50%) with timing slack (setup or CLK-to-Q margin) to reduce power.

Figure 3:
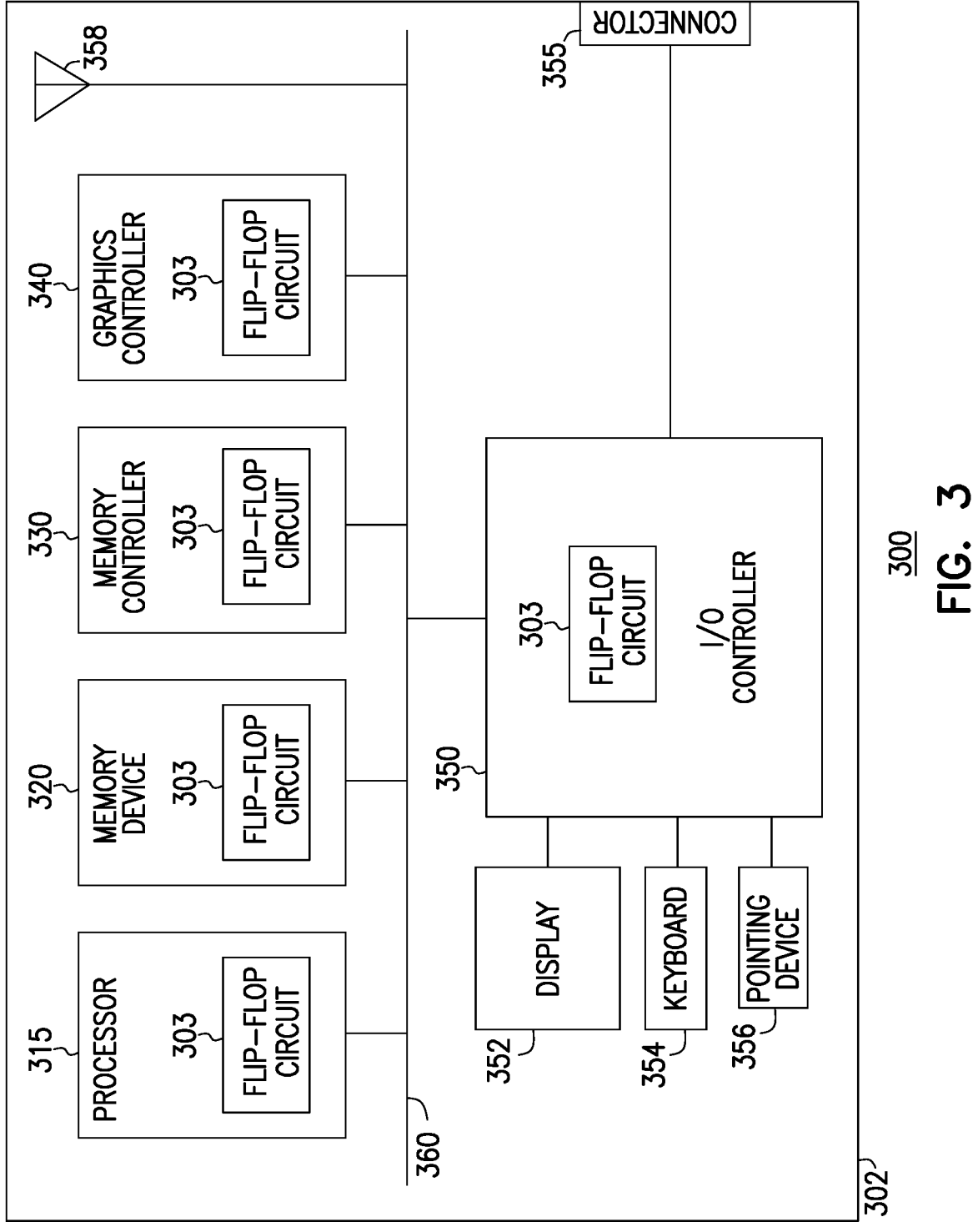
FIG. 3 shows an apparatus in the form of a system including the flip-flop circuit of FIG. 1 or FIG. 2, according to some embodiments described herein.

FIG. 3 shows an apparatus in the form of a system (e.g., electronic system) 300, according to some embodiments described herein. System 300 can include or be included in a mobile device, a wearable product, a computer (e.g., laptop or desktop), a server, a tablet, or other electronic device or system. As shown in FIG. 3, system 300 can include components located on a circuit board (e.g., printed circuit board (PCB)) 302, such as a processor 315, a memory device 320, a memory controller 330, a graphics controller 340, an I/O (input/output) controller 350, a display 352, a keyboard 354, a pointing device 356, at least one antenna 358, a connector 355, and a bus (e.g., on-board bus) 360. Bus 360 can include conductive lines (e.g., metal-based traces) on circuit board 302.

In some arrangements, system 300 does not have to include a display. Thus, display 352 can be omitted from system 300. In some arrangements, system 300 does not have to include any antenna. Thus, antenna 358 can be omitted from system 300. In some arrangements, system 300 does not have to include a connector. Thus, connector 355 can be omitted from system 300.

Processor 315 can include a general-purpose processor or an application specific integrated circuit (ASIC). Processor 315 can include a central processing unit (CPU).

Memory device 320 can include a dynamic random-access memory (DRAM) device, a static random-access memory (SRAM) device, a flash memory device, phase change memory, a combination of these memory devices, or other types of memory. FIG. 3 shows an example where memory device 320 is a stand-alone memory device separated from processor 315. In an alternative arrangement, memory device 320 and processor 315 can be located on the same die. In such an alternative arrangement, memory device 320 is an embedded memory in processor 315, such as embedded DRAM (eDRAM), embedded SRAM (eS-RAM), embedded flash memory, or another type of embedded memory.

Display 352 can include a liquid crystal display (LCD), a touchscreen (e.g., capacitive or resistive touchscreen), or another type of display. Pointing device 356 can include a mouse, a stylus, or another type of pointing device.

I/O controller 350 can include a communication module, which can include an interface, to allow components (e.g., at least one of processor 315, memory device 320, memory controller 330, graphics controller 340, and I/O controller 350) of system 300 to communicate by wired communication (e.g., through conductive lines (or traces), by wireless communication (e.g., communication through one or more antenna 358), or both. Such wireless communication may include communication in accordance with WiFi communication technique, Long Term Evolution Advanced (LTE-A) communication technique, or other communication techniques.

I/O controller 350 can also include a module to allow system 300 to communicate with other devices or systems in accordance with one or more of the following standards or specifications (e.g., I/O standards or specifications), including Universal Serial Bus (USB), DisplayPort (DP), High-Definition Multimedia Interface (HDMI), Thunderbolt, Peripheral Component Interconnect Express (PCIe), Ethernet, and other specifications.

Connector 355 can be arranged (e.g., can include terminals, such as pins) to allow system 300 to be coupled to an external device (or system). This may allow system 300 to communicate (e.g., exchange information) with such a device (or system) through connector 355. Connector 355 and at least a portion of bus 360 can include conductive lines that conform with at least one of USB, DP, HDMI, Thunderbolt, PCIe, Ethernet, and other specifications.

As shown in FIG. 3, each of processor 315, memory device 320, memory controller 330, graphics controller 340, and I/O controller 350 can include a flip-flop circuit 303, which can be flip-flop circuit 100 or flip-flop circuit 200 described above with reference to FIG. 1 and FIG. 2. FIG. 3 shows each of processor 315, memory device 320, memory controller 330, graphics controller 340, and I/O controller 350 including flip-flop circuit 303, as an example. However, fewer than all of processor 315, memory device 320, memory controller 330, graphics controller 340, and I/O controller 350 can include flip-flop circuit 303.

FIG. 3 shows the components of system 300 arranged separately from each other as an example. For example, each of processor 315, memory device 320, memory controller 330, graphics controller 340, and I/O controller 350 can be located on a separate IC (e.g., semiconductor die or an IC chip). In some arrangements, two or more components (e.g., processor 315, memory device 320, graphics controller 340, and I/O controller 350) of system 300 can be located on the same die (e.g., same IC chip) that can form or can be part of a system-on-chip (SoC).

The illustrations of the apparatuses (e.g., flip-flop circuits 100 and 200, and system 300) described above are intended to provide a general understanding of the structure of different embodiments and are not intended to provide a complete description of all the elements and features of an apparatus that might make use of the structures described herein.

The apparatuses and methods described above can include or be included in high-speed computers, communication and signal processing circuitry, single-processor module or multi-processor modules, single embedded processors or multiple embedded processors, multi-core processors, message information switches, and application-specific modules including multilayer or multi-chip modules. Such apparatuses may further be included as sub-components within a variety of other apparatuses (e.g., electronic systems), such as televisions, cellular telephones, personal computers (e.g., laptop computers, desktop computers, handheld computers, etc.), tablets (e.g., tablet computers), workstations, servers, radios, video players, audio players (e.g., MP3 (Motion Picture Experts Group, Audio Layer 3) players), vehicles, medical devices (e.g., heart monitors, blood pressure monitors, etc.), set top boxes, and others.

In the detailed description and the claims, the terms "first", "second", and "third", etc. are used merely as labels, and are not intended to impose numerical requirements on their objects.

In the detailed description and the claims, a list of items joined by the term "one of" can mean only one of the listed items. For example, if items A and B are listed, then the phrase "one of A and B" means A only (excluding B), or B only (excluding A). In another example, if items A, B, and C are listed, then the phrase "one of A, B, and C" means A only, B only, or C only. Item A can include a single element or multiple elements. Item B can include a single element or multiple elements. Item C can include a single element or multiple elements.

In the detailed description and the claims, a list of items joined by the term "at least one of" can mean any combination of the listed items. For example, if items A and B are listed, then the phrase "at least one of A and B" means A only, B only, or A and B. In another example, if items A, B, and C are listed, then the phrase "at least one of A, B, and C" means A only; B only; C only; A and B (excluding C); A and C (excluding B); B and C (excluding A); or all of A, B, and C. Item A can include a single element or multiple elements. Item B can include a single element or multiple elements. Item C can include a single element or multiple elements.

ADDITIONAL NOTES AND EXAMPLES

Example 1 includes subject matter (such as a device, an electronic apparatus (e.g., circuit, electronic system, or both), or a machine) comprising a first tristate inverter including an input node and an output node, a second tristate inverter including an input node coupled to the input node of the first tristate inverter, a first additional tristate inverter including an input node and an output node, a second additional tristate inverter including an input node and an output node coupled to the output node of the first additional tristate inverter, a first memory including a first memory node coupled to an output node of the second tristate inverter, and a first additional memory node coupled to the input node of the first additional tristate inverter, and a second memory including a second memory node coupled to an output node of the first tristate inverter, and a second additional memory node coupled to the input node of the second additional tristate inverter.

In Example 2, the subject matter of Example 1 may optionally include, wherein the first memory includes a third tristate inverter, the third tristate inverter including transistors to receive first and second clock signals, and the second memory includes a fourth tristate inverter, the fourth tristate inverter including transistors to receive the first and second clock signals.

In Example 3, the subject matter of Example 1 may optionally include, wherein the first memory includes an inverter coupled to the third tristate inverter, and the second memory includes an inverter coupled to the fourth tristate inverter.

In Example 4, the subject matter of Example 1, wherein the first tristate inverter and the first additional tristate inverter share at least one transistor.

In Example 5, the subject matter of Example 1 may optionally include, wherein the second tristate inverter and the second additional tristate inverter share at least one transistor.

In Example 6, the subject matter of Example 1 may optionally include, wherein the first tristate inverter includes a first transistor to receive a first clock signal, and the second tristate inverter includes a second transistor to receive the first clock signal, and the first and second transistors have different transistor types.

In Example 7, the subject matter of Example 6 may optionally include, wherein the first memory includes a third transistor to receive the first clock signal, and the second memory includes a fourth transistor to receive the first clock signal, and the third and fourth transistors have different transistor types.

In Example 8, the subject matter of Example 7 may optionally further comprise an inverter including an input node coupled to the output node of each of the first and second additional tristate inverters.

In Example 9, the subject matter of Example 8 may optionally further comprise an additional inverter including an output node coupled to the input node of each of the first and second tristate inverters.

In Example 10, the subject matter of Example 1 may optionally further comprise a node to receive an input clock signal, a first inverter including an input node coupled to the node and an output node to provide a first clock signal, and a second inverter including an input node coupled to the output node of the first inverter, and an output node to provide a second clock signal.

In Example 11, the subject matter of Example 8 may optionally comprise an integrated circuit (IC) chip on a circuit board, the IC chip includes a flip-flop circuit, and the flip-flop includes the first tristate inverter, the second tristate inverter, the first additional tristate inverter, the second additional tristate inverter, the first memory, and the second memory.

Example 12 includes subject matter (such as a device, an electronic apparatus (e.g., circuit, electronic system, or both), or a machine) comprising a multiplexer including a first input node to receive data information and a second input node to receive scan information, a first tristate inverter including an input node to receive information based on one of the data information and scan information selected by the multiplexer, a second tristate inverter including an input node coupled to the input node of the first tristate inverter, a first additional tristate inverter including an input node and an output node, a second additional tristate inverter including an input node and an output node coupled to the output node of the first additional tristate inverter, a first memory including an inverter coupled between an output node of the second tristate inverter and the input node of the first additional tristate inverter, and a second memory including an inverter coupled between an output node of the first tristate inverter and the input node of the second additional tristate inverter.

In Example 13, the subject matter of Example 12 may optionally include, wherein the first memory includes a third tristate inverter coupled to the inverter of the first memory, the third tristate inverter including transistors to receive first and second clock signals, and the second memory includes fourth tristate inverter coupled to the inverter of the second memory, the fourth tristate inverter including transistors to receive the first and second clock signals.

In Example 14, the subject matter of Example 12 may optionally include, wherein the multiplexer includes a third tristate inverter coupled to the first input node of the multiplexer, and a fourth tristate inverter coupled to the second input node of the multiplexer.

In Example 15, the subject matter of Example 12 may optionally further comprise an inverter coupled between an output node of the multiplexer and the input node of each of the first and second tristate inverters.

In Example 16, the subject matter of Example 14 may optionally further comprise an additional inverter including an input node coupled to the output node of each of the first and second additional tristate inverters In Example 17, the subject matter of Example 12 may optionally include, wherein the first tristate inverter includes a first transistor having a gate to receive a first clock signal, and the second tristate inverter includes a second transistor having a gate to receive the first clock signal, wherein the first and second transistors have different transistor types.

In Example 18, the subject matter of Example 17 may optionally include, wherein the first memory includes a third transistor having a gate to receive the first clock signal, and the second memory includes a fourth transistor having a gate to receive the first clock signal, wherein the third and fourth transistors have different transistor types.

In Example 19, the subject matter of Example 12 may optionally comprise a system-on-chip (SoC).

Example 20 includes subject matter (such as a method of operating a device, an electronic apparatus (e.g., circuit, electronic system, or both), or a machine) including providing data information to an input stage of a scan flip-flop circuit, storing the data information in a first memory node and a second memory node of a memory of the scan flip-flop circuit, and providing data information from the second memory node to an input node of an output stage of the flip-flop circuit, wherein the input stage includes a first tristate inverter and the output stage includes a second tristate inverter, the first and second tristate inverters sharing a transistor, and the input node of the output stage is separated from the first memory node by an inverter.

In Example 21, the subject matter of Example 20 may optionally include providing data information from the output stage to an input node of an inverter coupled to an output node of the second tristate inverter.

In Example 22, the subject matter of Example 20 may optionally include providing scan information to the input stage, wherein the scan information and the data information are provided to the input stage at different times.

The subject matter of Example 1 through Example 22 may be combined in any combination.

The above description and the drawings show some embodiments to enable those skilled in the art to practice the embodiments of the inventive subject matter. Other embodiments may incorporate structural, logical, electrical, process, and other changes. Examples merely typify possible variations. Portions and features of some embodiments may be included in, or substituted for, those of other embodiments. Many other embodiments will be apparent to those skilled in the art upon reading and understanding the above description. Therefore, the scope of various embodiments is determined by the appended claims, along with the full range of equivalents to which such claims are entitled.

What is claimed is:

1. An apparatus comprising:
a first tristate inverter including an input node and an output node;
a second tristate inverter including an input node coupled to the input node of the first tristate inverter;
a first additional tristate inverter including an input node and an output node;
a second additional tristate inverter including an input node and an output node coupled to the output node of the first additional tristate inverter;
a first memory including a first memory node coupled to an output node of the second tristate inverter, and a first additional memory node coupled to the input node of the first additional tristate inverter; and
a second memory including a second memory node coupled to an output node of the first tristate inverter, and a second additional memory node coupled to the input node of the second additional tristate inverter.

2. The apparatus of claim 1, wherein:
the first memory includes a third tristate inverter, the third tristate inverter including transistors to receive first and second clock signals; and
the second memory includes a fourth tristate inverter, the fourth tristate inverter including transistors to receive the first and second clock signals.

3. The apparatus of claim 2, wherein:
the first memory includes an inverter coupled to the third tristate inverter; and
the second memory includes an inverter coupled to the fourth tristate inverter.

4. The apparatus of claim 1, wherein the first tristate inverter and the first additional tristate inverter share at least one transistor.

5. The apparatus of claim 4, wherein the second tristate inverter and the second additional tristate inverter share at least one transistor.

6. The apparatus of claim 1, wherein:
the first tristate inverter includes a first transistor to receive a first clock signal; and
the second tristate inverter includes a second transistor to receive the first clock signal, and the first and second transistors have different transistor types.

7. The apparatus of claim 6, wherein:
the first memory includes a third transistor to receive the first clock signal; and
the second memory includes a fourth transistor to receive the first clock signal, and the third and fourth transistors have different transistor types.

8. The apparatus of claim 7, further comprising:
an inverter including an input node coupled to the output node of each of the first and second additional tristate inverters.

9. The apparatus of claim 8, further comprising:
an additional inverter including an output node coupled to the input node of each of the first and second tristate inverters.

10. The apparatus of claim 1, further comprising:
a node to receive an input clock signal;
a first inverter including an input node coupled to the node and an output node to provide a first clock signal; and
a second inverter including an input node coupled to the output node of the first inverter, and an output node to provide a second clock signal.

11. The apparatus of claim 1, wherein apparatus comprises an integrated circuit (IC) chip on a circuit board, the IC chip includes a flip-flop circuit, and the flip-flop includes the first tristate inverter, the second tristate inverter, the first additional tristate inverter, the second additional tristate inverter, the first memory, and the second memory.

12. An apparatus comprising:
a multiplexer including a first input node to receive data information and a second input node to receive scan information;
a first tristate inverter including an input node to receive information based on one of the data information and scan information selected by the multiplexer;
a second tristate inverter including an input node coupled to the input node of the first tristate inverter;
a first additional tristate inverter including an input node and an output node;
a second additional tristate inverter including an input node and an output node coupled to the output node of the first additional tristate inverter;
a first memory including an inverter coupled between an output node of the second tristate inverter and the input node of the first additional tristate inverter; and
a second memory including an inverter coupled between an output node of the first tristate inverter and the input node of the second additional tristate inverter.

13. The apparatus of claim 12, wherein:
the first memory includes a third tristate inverter coupled to the inverter of the first memory, the third tristate inverter including transistors to receive first and second clock signals; and
the second memory includes fourth tristate inverter coupled to the inverter of the second memory, the fourth tristate inverter including transistors to receive the first and second clock signals.

14. The apparatus of claim 12, wherein the multiplexer includes:
a third tristate inverter coupled to the first input node of the multiplexer; and
a fourth tristate inverter coupled to the second input node of the multiplexer.

15. The apparatus of claim 12, further comprising:
an inverter coupled between an output node of the multiplexer and the input node of each of the first and second tristate inverters.

16. The apparatus of claim 15, further comprising:

an additional inverter including an input node coupled to the output node of each of the first and second additional tristate inverters.

17. The apparatus of claim 12, wherein:

the first tristate inverter includes a first transistor having a gate to receive a first clock signal; and the second tristate inverter includes a second transistor having a gate to receive the first clock signal, wherein the first and second transistors have different transistor types.

18. The apparatus of claim 17, wherein:

the first memory includes a third transistor having a gate to receive the first clock signal; and the second memory includes a fourth transistor having a gate to receive the first clock signal, wherein the third and fourth transistors have different transistor types.

19. The apparatus of claim 12, wherein apparatus comprises a system-on-chip (SoC).

20. A method comprising:

providing data information to an input stage of a scan flip-flop circuit;

storing the data information in a first memory node and a second memory node of a memory of the scan flip-flop circuit; and providing data information from the second memory node to an input node of an output stage of the flip-flop circuit, wherein the input stage includes a first tristate inverter and the output stage includes a second tristate inverter, the first and second tristate inverters sharing a transistor, and the input node of the output stage is separated from the first memory node by an inverter.

21. The method of claim 20, further comprising:

providing data information from the output stage to an input node of an inverter coupled to an output node of the second tristate inverter.

22. The method of claim 20, further comprising:

providing scan information to the input stage, wherein the scan information and the data information are provided to the input stage at different times.

* * * * *